(12) United States Patent  (10) Patent No.: US 10,505,082 B2
Fan  (45) Date of Patent: Dec. 10, 2019

(54) QUANTUM DOT LIGHT EMITTING DIODE AND MANUFACTURING METHOD

(71) Applicant: HUIZHOU CHINA STAR OPTOELECTRONICS TECHNOLOGY CO., LTD., Huizhou, Guangdong (CN)

(72) Inventor: Yong Fan, Huizhou Guangdong (CN)

(73) Assignee: HUIZHOU CHINA STAR OPTOELECTRONICS TECHNOLOGY CO., LTD., Huizhou, Guangdong (CN)

( * ) Notice: Subject to any disclaimer, the term of this patent is extended or adjusted under 35 U.S.C. 154(b) by 0 days.

(21) Appl. No.: 16/010,609

(22) Filed: Jun. 18, 2018

(65) Prior Publication Data

US 2019/0245122 A1  Aug. 8, 2019

Related U.S. Application Data

(63) Continuation of application No. PCT/CN2018/078805, filed on Mar. 13, 2018.

(30) Foreign Application Priority Data

Feb. 6, 2018  (CN) .......................... 2018 1 0117797

(51) Int. Cl.
*H01L 33/50* (2010.01)
*H01L 33/48* (2010.01)
(Continued)

(52) U.S. Cl.
CPC ........ *H01L 33/507* (2013.01); *H01L 31/0203* (2013.01); *H01L 33/486* (2013.01);
(Continued)

(58) Field of Classification Search
CPC .................................................. H01L 31/02489
See application file for complete search history.

(56) References Cited

U.S. PATENT DOCUMENTS

2012/0091923 A1* 4/2012 Kastner-Jung ......... B60Q 3/745
  315/360
2015/0228926 A1* 8/2015 Washio ............... H01L 51/5253
  257/40

(Continued)

FOREIGN PATENT DOCUMENTS

CN  105226166  11/2017

*Primary Examiner* — Cheung Lee
(74) *Attorney, Agent, or Firm* — Leong C. Lei

(57) ABSTRACT

Provided are a quantum dot light emitting diode and a manufacturing method. The quantum dot light emitting diode comprises: a pair of electrodes, arranged side by side and spaced; a flip chip light emitting diode, disposed on the electrodes and electrically connected to the electrodes; a quantum dot interlayer, disposed on the flip chip light emitting diode; a package layer, covering the electrodes, the flip chip light emitting diode and the quantum dot interlayer; and a whitening adhesive layer, surrounding the package layer. The quantum dot interlayer is disposed to isolate the invasion of the external water and oxygen to the quantum dot layer and the light emitting diode chip to form an environment, in which the quantum dots are isolated from water and oxygen.

7 Claims, 2 Drawing Sheets

(51) Int. Cl.
*H01L 33/56* (2010.01)
*H01L 33/54* (2010.01)
*H01L 31/0203* (2014.01)

(52) U.S. Cl.
CPC .............. *H01L 33/50* (2013.01); *H01L 33/54* (2013.01); *H01L 33/56* (2013.01); *H01L 2933/005* (2013.01); *H01L 2933/0033* (2013.01); *H01L 2933/0041* (2013.01)

(56) References Cited

U.S. PATENT DOCUMENTS

2017/0005238 A1* 1/2017 Hung ...................... H01L 33/50
2017/0301843 A1* 10/2017 Kim ........................ H01L 33/62
2017/0373264 A1* 12/2017 Liu ..................... H01L 51/5012

* cited by examiner

QUANTUM DOT LIGHT EMITTING DIODE AND MANUFACTURING METHOD

CROSS-REFERENCE TO RELATED APPLICATION

This application is a continuing application of PCT Patent Application No. PCT/CN2018/078805 entitled "Quantum dot light emitting diode and manufacturing method", filed on Mar. 13, 2018, which claims priority to Chinese Patent Application No. 201810117797.1, filed on Feb. 6, 2018, both of which are hereby incorporated in its entireties by reference.

FIELD OF THE INVENTION

The present invention relates to a panel display field, and more particularly to a quantum dot light emitting diode and a manufacturing method.

BACKGROUND OF THE INVENTION

Quantum Dot (QD) is a nano-semiconductor structure which binds conduction band electrons, valence band holes and excitons in three directions, also called nanocrystalline, i.e. a kind of nano-particles composed of II-VI group elements or III-V group elements. The particle sizes of the quantum dots are generally between 1 nm to 10 nm, and due to the quantum confinement of the electrons and the holes, the continuous band structure becomes a discrete level structure having a molecular characteristic and can be excited to emit fluorescence. The CSP (Chip Scale Package, chip level package) LED as a stand-less LED has become an important development objective of the LED for now due to its simple manufacturing process, heat dissipation, small light emitting surface and other advantages.

FIG. 1 is an absorption spectrum of red quantum dots and green quantum dots. FIG. 2 is an emission spectrum of red quantum dots and green quantum dots. In FIG. 1 and FIG. 2, the gray line represents the green light quantum dot and the black line represents the red light quantum dot. As shown in FIG. 2, the full widths at half maximum (FWHM) of the red quantum dots and the green quantum dots are very narrow. Therefore, adding quantum dots to the light source can greatly improve the color gamut of the liquid crystal display.

However, the luminous efficiency of the quantum dots gets lower due to the severe temperature quenching and temperature rising. Besides, in case that the quantum dots are exposed to a water and oxygen environment, there is an irreversible and rapid decline in the fluorescence efficiency. Therefore, the quantum dots need to be isolated from the water and oxygen environment, isolated from high temperatures, or provided with a good heat dissipation environment.

SUMMARY OF THE INVENTION

An objective of the present invention is to provide a quantum dot light emitting diode and a manufacturing method to improve the barrier properties of quantum dots to moisture and oxygen in the high-temperature and high-humidity usage environments.

For solving the aforesaid technical issue, the present invention provides a quantum dot light emitting diode, comprising:
a pair of electrodes, arranged side by side and spaced;
a flip chip light emitting diode, disposed on the electrodes and electrically connected to the electrodes;
a quantum dot interlayer, disposed on the flip chip light emitting diode;
a package layer, covering the electrodes, the flip chip light emitting diode and the quantum dot interlayer; and
a whitening adhesive layer, surrounding the package layer.

A micro-nano-structured organic layer is further provided on the package layer and the whitening adhesive layer.

The quantum dot interlayer comprises: a quantum dot layer, and a lower barrier layer and an upper barrier layer, which are symmetrically disposed on an upper side and a lower side of the quantum dot layer.

Materials of the lower barrier layer and the upper barrier layer are transparent glass or ceramics with a low water permeability and a low oxygen permeability.

The package layer is an inorganic package layer prepared by atomic layer deposition or an organic waterproof coating layer formed by coating.

The inorganic package layer has a single-layer structure, and a material of the single-layered structure is any one of aluminum oxide, zirconium oxide and titanium dioxide.

The inorganic package layer has a multilayer structure, and a material of each layer of the multilayer structure is any one of aluminum oxide, zirconium oxide and titanium dioxide.

The flip chip light emitting diode is a blue light flip chip light emitting diode.

The present invention further provides a manufacturing method of a quantum dot light emitting diode, comprising steps of:
arranging a pair of electrodes side by side with a space inbetween;
disposing a flip chip light emitting diode on the electrodes to be electrically connected to the electrodes;
disposing a quantum dot interlayer on the flip chip light emitting diode;
arranging a package layer, which covers the electrodes, the flip chip light emitting diode and the quantum dot interlayer; and
forming a whitening adhesive layer, which surrounds the package layer with a mould; and
forming a micro-nano-structured organic layer on the package layer and the whitening adhesive layer.

The package layer is an inorganic package layer prepared by atomic layer deposition or an organic waterproof coating layer formed by coating.

The benefits of the embodiment of the present invention are: by disposing the quantum dot interlayer, the invasion of the external water and oxygen to the quantum dot layer and the light emitting diode chip can be isolated to form an environment, in which the quantum dots are isolated from water and oxygen, which is beneficial to improve the luminous efficiency and service life of the quantum dots; the micro-nano-structured is arranged to improve the light output efficiency; the inorganic package layer is prepared by atomic layer deposition to have a smooth surface and a uniform thickness and no cracking issue of film layer.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
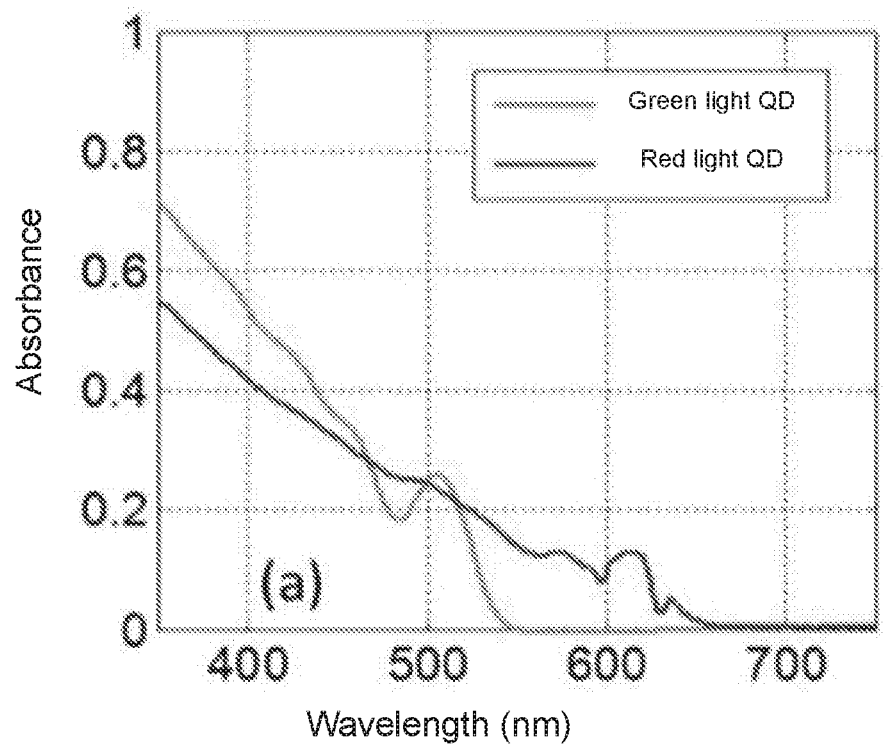
FIG. 1 is an absorption spectrum of red quantum dots and green quantum dots.
Figure 2:
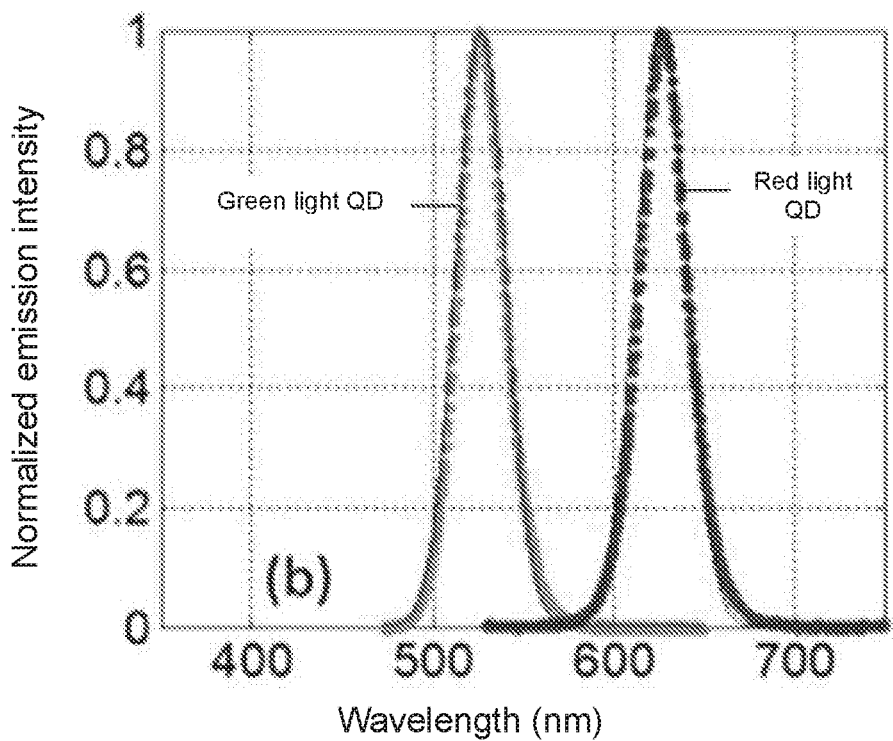
FIG. 2 is an emission spectrum of red quantum dots and green quantum dots.
Figure 3:
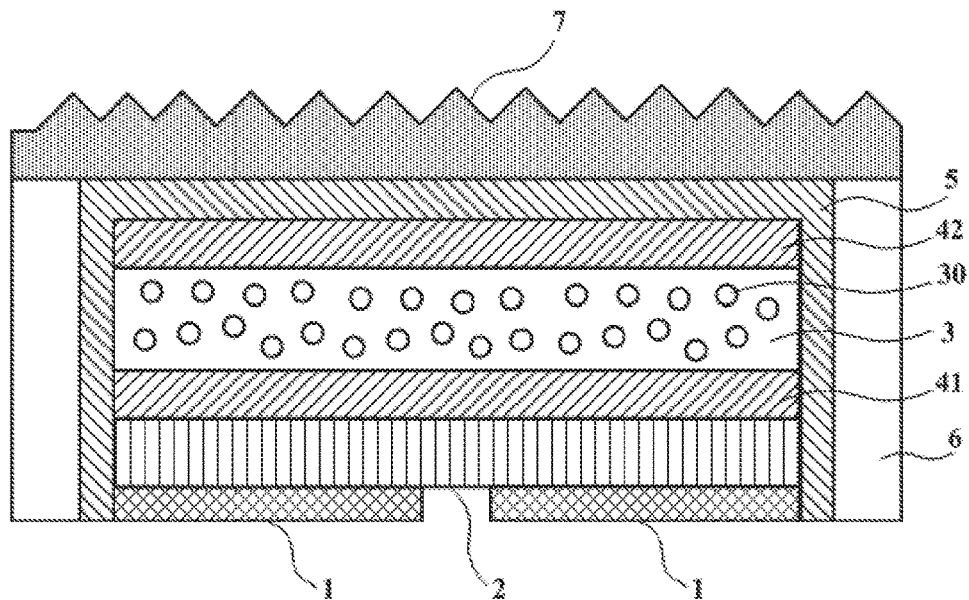
FIG. 3 is a structural diagram of a quantum dot light emitting diode according to the first embodiment of the present invention.

Please refer to FIG. 3. The first embodiment of the present invention provides a quantum dot light emitting diode, comprising:

- a pair of electrodes 1, arranged side by side and spaced;
- a flip chip light emitting diode 2, disposed on the electrodes 1 and electrically connected to the electrodes 1;
- a quantum dot interlayer, disposed on the flip chip light emitting diode 2;
- a package layer 5, covering the electrodes 1, the flip chip light emitting diode 2 and the quantum dot interlayer; and
- a whitening adhesive layer 6, surrounding the package layer 5.

Specifically, in this embodiment, the flip chip light emitting diode 2 is utilized, which has good heat dissipation and high reliability, and can withstand high current driving and possesses a high cost performance.

The quantum dot interlayer comprises: a quantum dot layer 3, and a lower barrier layer 41 and an upper barrier layer 42, which are symmetrically disposed on an upper side and a lower side of the quantum dot layer 3. The quantum dot layer 3 comprises red quantum dots and green quantum dots (shown by the reference numeral 30 in FIG. 3), and the flip chip light emitting diode 2 is a blue light flip chip light emitting diode. The flip chip light emitting diode 2 emits blue light after being connected to the power source. After entering the quantum dot layer 3, the blue light excites the red quantum dots and the green quantum dots in the quantum dot layer 3 to emit red light and green light, respectively. The red light and green light emitted by the quantum dot layer 3 and the blue light emitted by the blue light flip chip light emitting diode 2 are mixed to form white light for emission. Materials of the lower barrier layer 41 and the upper barrier layer 42 are transparent glass or ceramics with a low water permeability and a low oxygen permeability.

The electrodes 1, the flip chip light emitting diode 2 and the quantum dot interlayer are covered by the package layer 5. The package layer 5 can be prepared by atomic layer deposition (ALD). Namely, the package layer 5 is an inorganic package layer with a smooth surface and a uniform thickness and without cracking issue of film layer. The inorganic package layer 5 can have a single-layer structure or a multiple layer structure. When the inorganic package layer 5 is a single-layer structure, a material thereof is any one of aluminum oxide ($Al_2O_3$), zirconium oxide ($ZrO_2$) and titanium dioxide ($TiO_2$); when the inorganic package layer 5 is a multilayer structure, a material of each layer of the multilayer structure is any one of aluminum oxide, zirconium oxide and titanium dioxide. In order to achieve a better water and oxygen barrier environment, the multilayer structure of the inorganic package layer 5 can utilize different materials for all adjacent layers. The thickness of the inorganic package layer 5 is between 10 nm and 120 nm. Due to the ALD film formation, the thickness is almost unaffected by the tape angle and the film is uniformly formed. Thus, a dense inorganic barrier layer can be formed to isolate the water and oxygen environment. The inorganic package layer 5 appears to be an inverted U type and covers the electrodes 1, the light emitting diode chip 2, and the quantum dot interlayer to form an enclosed structure.

The package layer 5 can also be coated with a layer of low water-permeable and low oxygen-permeable organic waterproof material, such as CYTOP (a new type of transparent fluorine plastic, not only capable of maintaining the inherent characteristics of traditional fluorine plastic but also possessing an amorphous structure, high transparency and the characteristics of ultraviolet light transmission).

A whitening adhesive layer 6, which surrounds the package layer 5, is formed with a mould. The upper surface of the whitening adhesive layer 6 is leveled with the upper surface of the package layer 5. The whitening adhesive layer 6 can further isolate the quantum dot interlayer from external water and oxygen to prevent the water and oxygen from entering the quantum dot layer to result in failure of the quantum dots therein.

In order to improve light efficiency, a micro-nano-structured organic layer 7 is further provided on the package layer 5 and the whitening adhesive layer 6.

Figure 4:
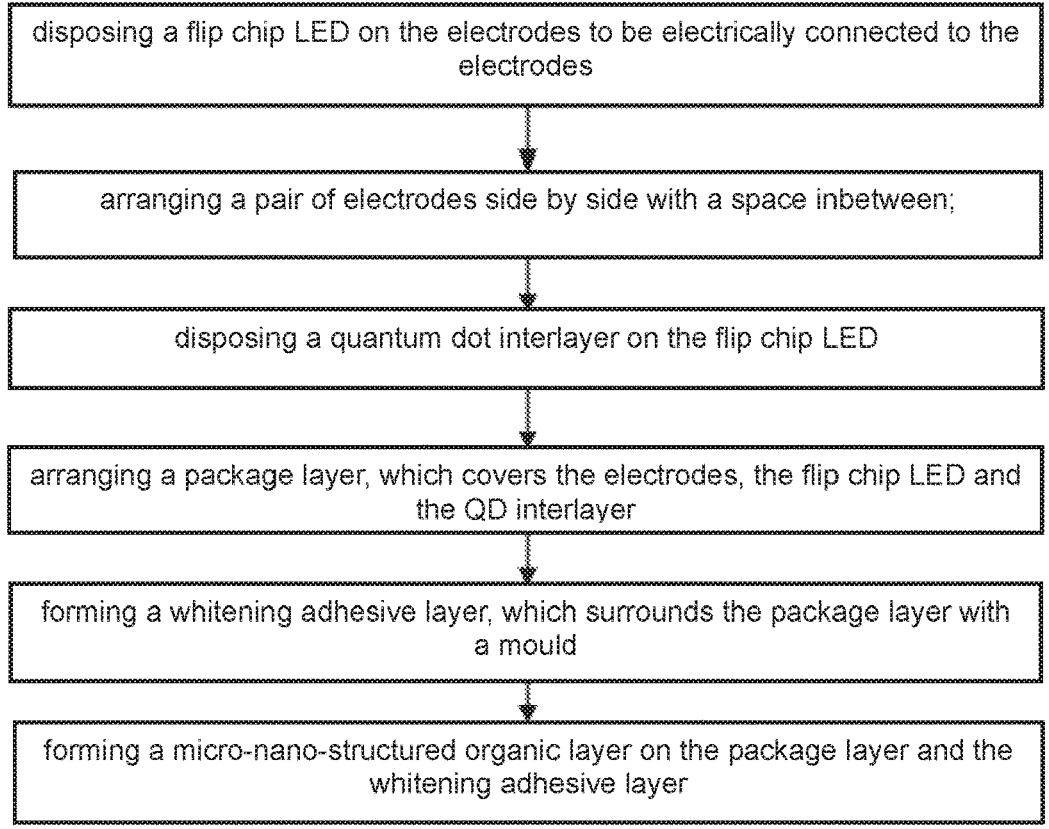
FIG. 4 is a flowchart of a manufacturing method of a quantum dot light emitting diode according to the second embodiment of the present invention.

As shown in FIG. 4, corresponding to quantum dot light emitting diode according to the first embodiment of the present invention, the second embodiment of the present invention further provides a manufacturing method of a quantum dot light emitting diode, comprising steps of:

- arranging a pair of electrodes side by side with a space inbetween;
- disposing a flip chip light emitting diode on the electrodes to be electrically connected to the electrodes;
- disposing a quantum dot interlayer on the flip chip light emitting diode;
- arranging a package layer, which covers the electrodes, the flip chip light emitting diode and the quantum dot interlayer; and
- forming a whitening adhesive layer, which surrounds the package layer with a mould; and
- forming a micro-nano-structured organic layer on the package layer and the whitening adhesive layer.

The package layer is an inorganic package layer prepared by atomic layer deposition or an organic waterproof coating layer formed by coating.

With the aforesaid descriptions, the benefits of the embodiment of the present invention are: by disposing the quantum dot interlayer, the invasion of the external water and oxygen to the quantum dot layer and the light emitting diode chip can be isolated to form an environment, in which the quantum dots are isolated from water and oxygen, which is beneficial to improve the luminous efficiency and service life of the quantum dots; the micro-nano-structured is arranged to improve the light output efficiency; the inorganic package layer is prepared by atomic layer deposition to have a smooth surface and a uniform thickness and no cracking issue of film layer.

Above are embodiments of the present invention, which does not limit the scope of the present invention. Any equivalent amendments within the spirit and principles of the embodiment described above should be covered by the protected scope of the invention.

What is claimed is:

1. A quantum dot light emitting diode, comprising:
a pair of electrodes, arranged side by side and spaced;
a flip chip light emitting diode, disposed on the electrodes and electrically connected to the electrodes;
a quantum dot interlayer, disposed on the flip chip light emitting diode;
a package layer, covering the electrodes, the flip chip light emitting diode and the quantum dot interlayer; and
an adhesive layer, surrounding the package layer;
wherein the quantum dot interlayer comprises: a quantum dot layer, and a lower barrier layer and an upper barrier layer, which are symmetrically disposed on an upper side and a lower side of the quantum dot layer.

2. The quantum dot light emitting diode according to claim 1, wherein an organic layer is further provided on the package layer and the adhesive layer.

3. The quantum dot light emitting diode according to claim 1, wherein materials of the lower barrier layer and the upper barrier layer are transparent glass or ceramics with a low water permeability and a low oxygen permeability.

4. The quantum dot light emitting diode according to claim 1, wherein the package layer is an inorganic package layer prepared by atomic layer deposition or an organic waterproof coating layer formed by coating.

5. The quantum dot light emitting diode according to claim 4, wherein the inorganic package layer has a single-layer structure, and a material of the single-layered structure is any one of aluminum oxide, zirconium oxide and titanium dioxide.

6. The quantum dot light emitting diode according to claim 4, wherein the inorganic package layer has a multi-layer structure, and a material of each layer of the multilayer structure is any one of aluminum oxide, zirconium oxide and titanium dioxide.

7. The quantum dot light emitting diode according to claim 1, wherein the flip chip light emitting diode is a blue light flip chip light emitting diode.

* * * * *